United States Patent
Gianoulakis et al.

(10) Patent No.: US 6,309,461 B1
(45) Date of Patent: *Oct. 30, 2001

(54) CRYSTAL GROWTH AND ANNEALING METHOD AND APPARATUS

(75) Inventors: Steven E. Gianoulakis, Albuquerque, NM (US); Robert Sparrow, North Brookfield, MA (US)

(73) Assignees: Sandia Corporation, Albuquerque, NM (US); Corning, Incorporated, Corning, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/327,043

(22) Filed: Jun. 7, 1999

(51) Int. Cl.[7] .................................................... C30B 35/00
(52) U.S. Cl. ........................................................... 117/206
(58) Field of Search ........................... 117/200–206, 940, 117/900, 223

(56) References Cited

U.S. PATENT DOCUMENTS

| | | | |
|---|---|---|---|
| 2,214,976 | 9/1940 | Stockbarger | 23/273 |
| 3,514,265 * | 5/1970 | Pastore | 23/301 |
| 3,649,552 * | 3/1972 | Robinson et al. | 252/301.4 |
| 3,870,472 * | 3/1975 | Adamski et al. | 23/273 SP |
| 3,925,147 * | 12/1975 | Kimura | 156/603 |
| 4,030,965 * | 6/1977 | Hammond et al. | 156/616 R |
| 4,038,201 | 7/1977 | Hargreaves | 252/300 |
| 4,076,572 * | 2/1978 | Kimura | 156/603 |
| 4,190,486 * | 2/1980 | Kyle | 156/601 |
| 4,485,072 * | 11/1984 | Apilat et al. | 422/249 |
| 5,256,381 * | 10/1993 | Tada et al. | 156/605 |
| 5,260,037 * | 11/1993 | Kitaura et al. | 422/249 |
| 5,264,189 * | 11/1993 | Yamashita et al. | 422/249 |
| 5,785,758 * | 7/1998 | Yamagishi et al. | 117/218 |
| 5,935,326 * | 8/1999 | Kotooka et al. | 117/217 |

FOREIGN PATENT DOCUMENTS

| | | | |
|---|---|---|---|
| 0 338 411 | 4/1989 | (EP) . | |
| 0 972 863 A1 | 1/2000 | (EP) . | |
| 358143520A * | 8/1983 | (JP) | H01L/21/18 |
| 10-231194 | 2/1997 | (JP) . | |
| 9-315894 | 2/1997 | (JP) . | |
| 10-265300 | 3/1997 | (JP) . | |
| 11-79880 | 9/1997 | (JP) . | |
| 11-87808 | 10/1997 | (JP) . | |
| 10-251097 | 9/1998 | (JP) . | |
| 11-92269 | 4/1999 | (JP) . | |

* cited by examiner

Primary Examiner—Benjamin L. Utech
Assistant Examiner—Matthew A. Anderson
(74) Attorney, Agent, or Firm—V. Gerald Grafe; Edward F. Murphy

(57) ABSTRACT

A method and apparatus for producing crystals that minimizes birefringence even at large crystal sizes, and is suitable for production of $CaF_2$ crystals. The method of the present invention comprises annealing a crystal by maintaining a minimal temperature gradient in the crystal while slowly reducing the bulk temperature of the crystal. An apparatus according to the present invention includes a thermal control system added to a crystal growth and annealing apparatus, wherein the thermal control system allows a temperature gradient during crystal growth but minimizes the temperature gradient during crystal annealing. An embodiment of the present invention comprises a secondary heater incorporated into a conventional crystal growth and annealing apparatus. The secondary heater supplies heat to minimize the temperature gradients in the crystal during the annealing process. The secondary heater can mount near the bottom of the crucible to effectively maintain appropriate temperature gradients.

21 Claims, 8 Drawing Sheets

CRYSTAL GROWTH AND ANNEALING METHOD AND APPARATUS

This invention was made with Government support under Contract DE-AC04-94AL85000 awarded by the U.S. Department of Energy. The Government has certain rights in the invention.

BACKGROUND OF THE INVENTION

This invention relates to the field of crystal growth and annealing, specifically a method and apparatus for crystal growth and annealing with minimized residual stress and suitable for production of calcium fluoride ($CaF_2$) crystals.

Crystals are used in a wide variety of applications, including as lenses in digital broadcast cameras and as optical elements in lithography such as in semiconductor processing. Semiconductor lithography at 193 nm wavelengths commonly used fused silica optical elements. Unfortunately, fused silica is damaged by high fluence at 193 nm. The next generation of semiconductor lithography is expected to use 157 nm wavelength illumination. Another material will be required since fused silica is quite opaque to 157 nm wavelength illumination.

$CaF_2$ is one of several candidates for optical elements in 193 nm and 157 nm lithography. Current crystal growth and annealing processes lead to high residual stress in large $CaF_2$ crystals, however, limiting the applicability of $CaF_2$ crystals. High residual stresses in a crystal can cause the crystal to exhibit a spatially varying index of refraction. This can lead to wavefront errors, image degradation, and birefringence, all detrimental to the effectiveness of an optical system using $CaF_2$.

Contemporary crystal growth and annealing is illustrated by FIG. 1(a,b). A powder P is placed in a crucible C. During the growth phase, the powder P is heated to a liquid phase (roughly 1500° C. for $CaF_2$, for example). The crucible C is slowly lowered from the heated region R1, with the crystal X growing in the region R2 where the liquid can cool below a critical temperature. The difference between the liquid temperature T1 and crystal temperature T2 leads to a temperature gradient across the crystal/liquid combination.

Once the crystal growth phase is complete, the crystal X is annealed. FIG. 1b shows the arrangement in a conventional annealing process. The crystal X is placed back in the heated region R1, but the temperature is less than that required to liquefy the crystal X. The crystal loses heat through its top, bottom, and sides. The temperature of the crystal is slowly reduced until it reaches a certain value, typically room temperature (annealing a $CaF_2$ crystal conventionally takes approximately 30 days to bring the temperature from 1000° C. to 50° C., at cooling rates of less than 1° C. per hour). The temperature of the crystal is slowly reduced, conventionally still with a vertical temperature gradient as represented by differences between T1 and T2. After the crystal is completely cooled, typically the top and bottom are cut off to produce a blank. The blank can then be ground and polished to produce an optical element such as a lens, tube, or plate.

Current $CaF_2$ crystal production methods reliably produce $CaF_2$ crystals of limited size, because the $CaF_2$ crystals produced exhibit unacceptably high birefringence at sizes over about 6 inch diameter. The limited size crystals limit the numerical aperture available with resulting optical elements, limiting the optical elements' utility for high density lithography.

Accordingly, there is a need for a method and apparatus for producing crystals that minimizes birefringence even at large crystal sizes, and is suitable for production of $CaF_2$ crystals.

SUMMARY OF THE INVENTION

The present invention provides a method and apparatus for producing crystals that minimizes birefringence even at large crystal sizes, and is suitable for production of $CaF_2$ crystals. The method of the present invention comprises annealing a crystal by maintaining a minimal temperature gradient across the crystal while slowly reducing the bulk temperature of the crystal. An apparatus according to the present invention includes a thermal control system added to a crystal growth and annealing apparatus, wherein the thermal control system allows a temperature gradient during crystal growth but minimizes the temperature gradient during crystal annealing.

An embodiment of the present invention comprises a secondary heater incorporated into a conventional crystal growth and annealing apparatus. The secondary heater supplies heat to minimize the temperature gradients in the crystal during the annealing process. The secondary heater can mount near the bottom of the crucible to effectively maintain appropriate temperature gradients.

Advantages and novel features will become apparent to those skilled in the art upon examination of the following description or may be learned by practice of the invention. The objects and advantages of the invention may be realized and attained by means of the instrumentalities and combinations particularly pointed out in the appended claims.

DESCRIPTION OF THE FIGURES

The accompanying drawings, which are incorporated into and form part of the specification, illustrate embodiments of the invention and, together with the description, serve to explain the principles of the invention.

DETAILED DESCRIPTION OF THE INVENTION

The present invention provides a method and apparatus for crystal growth and annealing that minimizes residual stress and associated birefringence, and is suitable for producing $CaF_2$ crystals.

Method

The method of the present invention is similar to conventional crystal production methods. With the present invention, however, the temperature gradient across the crystal is minimized during annealing. The temperature gradient is kept high during growth, but minimized during annealing. Minimizing the temperature gradient during annealing has been found by the inventors to reduce residual stress and associated birefringence.

A crystal can be grown at temperatures around the liquid phase temperature of the crystal material, with a temperature gradient during growth of 100° C. or more over 6 inches. During annealing, the crystal can be cooled from the growth temperature to room temperature, with a temperature gradient of less than about 8° C. per inch throughout the annealing cycle. For $CaF_2$, the growth temperature can be around 1500° C. Annealing can cool the crystal to room temperature with temperature gradients in any direction of less than about 8° C. per inch throughout the cooling process; temperature gradients of less than about 4° C. per inch can produce even lower residual stress and consequent undesirable optical properties. It is especially important to maintain a low temperature gradient during the initial phases of annealing, when the hot crystal has a relatively low yield strength.

Figure 1A:
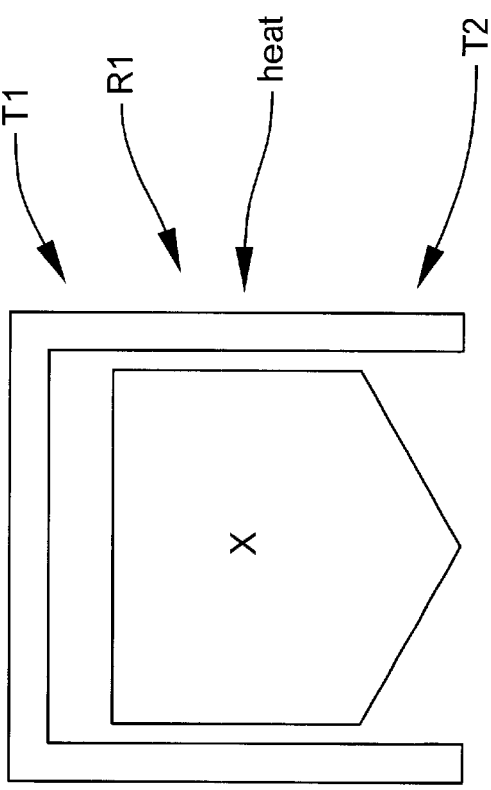
FIGS. 1a and 1b are diagrams of a conventional crystal growing and annealing apparatus.
Figure 1B:
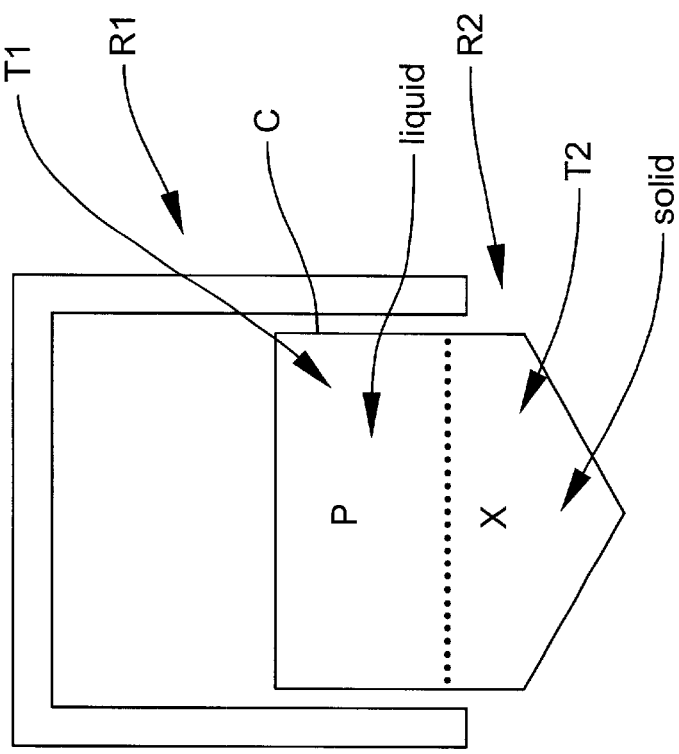
Figure 2:
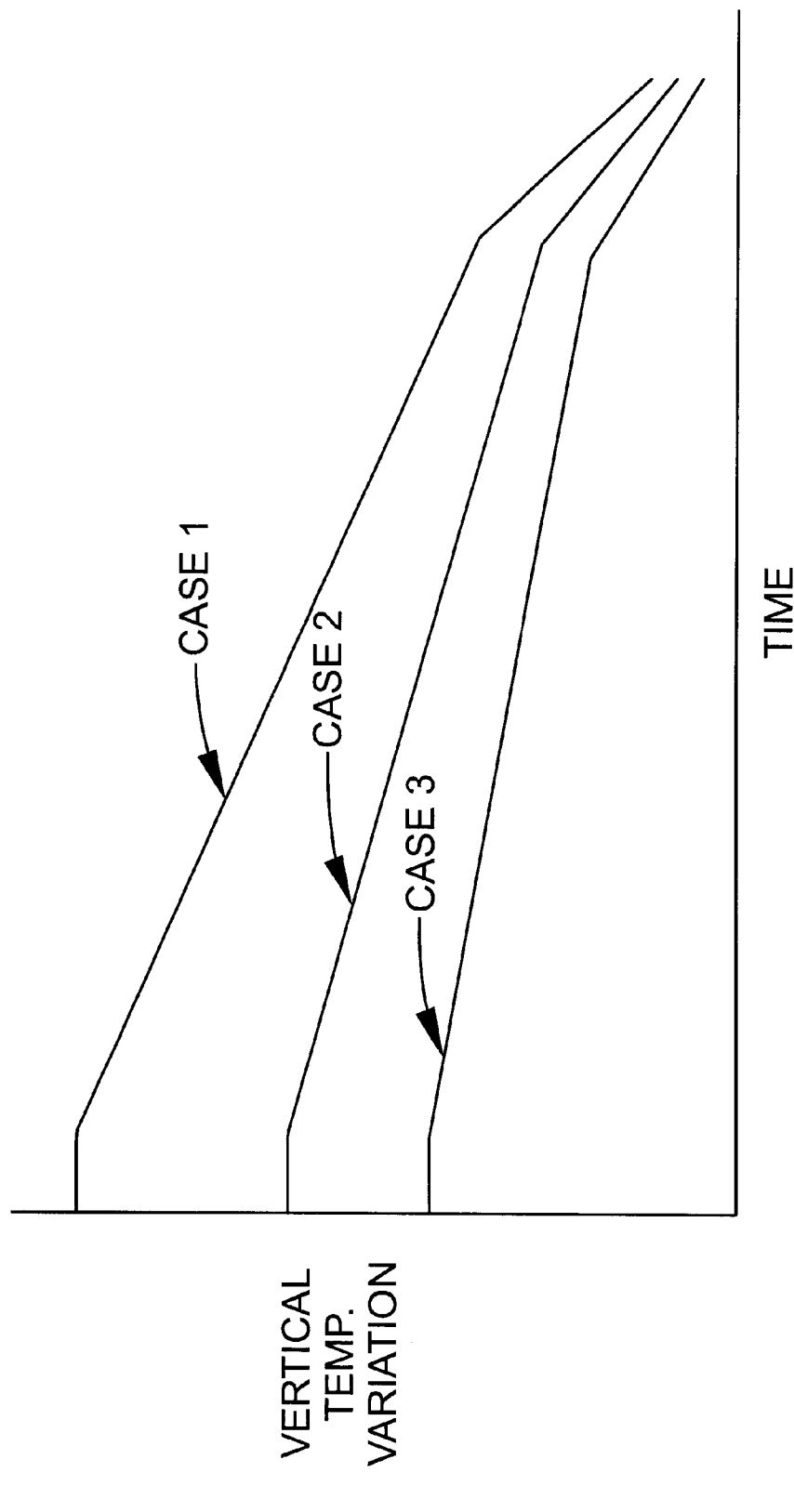
FIG. 2 is a graph of annealing times and vertical temperature gradient.

FIG. 2 is a graph of three different vertical temperature gradients during annealing. In a conventional crystal growth and annealing apparatus the vertical temperature gradient exceeds the temperature gradients in any other direction. The vertical temperature gradient is depicted as a function of annealing time. Case 1 is representative of conventional annealing processes, exhibiting a high initial vertical temperature gradient slowly decaying as the crystal temperature is reduced. Case 2 represents an annealing process according to the present invention, exhibiting a much lower vertical temperature gradient and also decaying as the crystal temperature is reduced. Case 3 represents an annealing process according to the present invention, exhibiting an even lower initial vertical temperature gradient decaying as the crystal temperature is reduced. For $CaF_2$ crystal annealing, the time scale can be roughly 20 to 40 days. The maximum vertical temperature gradient can be 100° C. or more over 6 inches for Case 1, about 8° C. per inch or less for Case 2, and about 4° C. per inch or less for Case 3. Those skilled in the art will appreciate similar relationships for other crystal materials such as magnesium fluoride ($MgF_2$) and sapphire ($SiO_2$), with variations due to growth temperature, thermal expansion coefficients, and yield strength.

Figure 3:
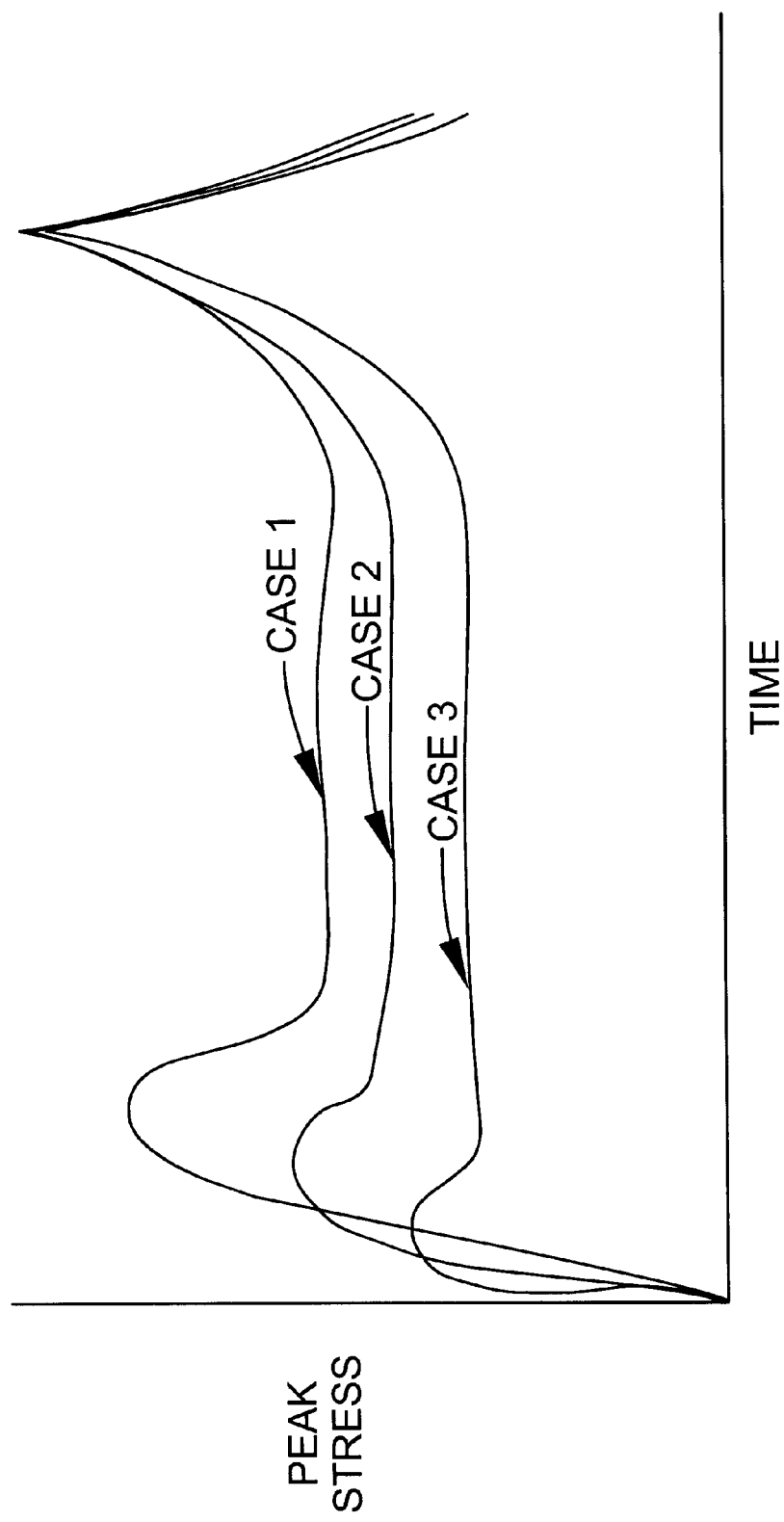
FIG. 3 is a graph of stress response in crystals during annealing processes of FIG. 2.

FIG. 3 is a graph of the von Mises transient peak stress response of a crystal during the annealing times and vertical temperature gradients of FIG. 2. As the crystal cools, thermal expansion and contraction produce internal stresses. If the internal stresses are high, dislocation motion and slippage can occur and produce residual stresses in the cooled crystal. Case 1 (conventional annealing conditions) displays increased peak stress as compared with Case 2 and Case 3, especially in the early stages of annealing. The early stages of annealing correspond with highest crystal material temperature and associated minimal yield strength. Consequently, high stress in the early stages is more likely to exceed the crystal material's yield strength and produce dislocation motion and slippage. Dislocation motion and slippage produce residual stress in the cooled crystal and resulting undesirable optical properties. For $CaF_2$ crystals, the peak stress for Case 1 can be about 7 MPa, for Case 2 about 5.5 MPa, for Case 3 about 4.5 MPa. The annealing time can be about 700 hours.

Figure 4:
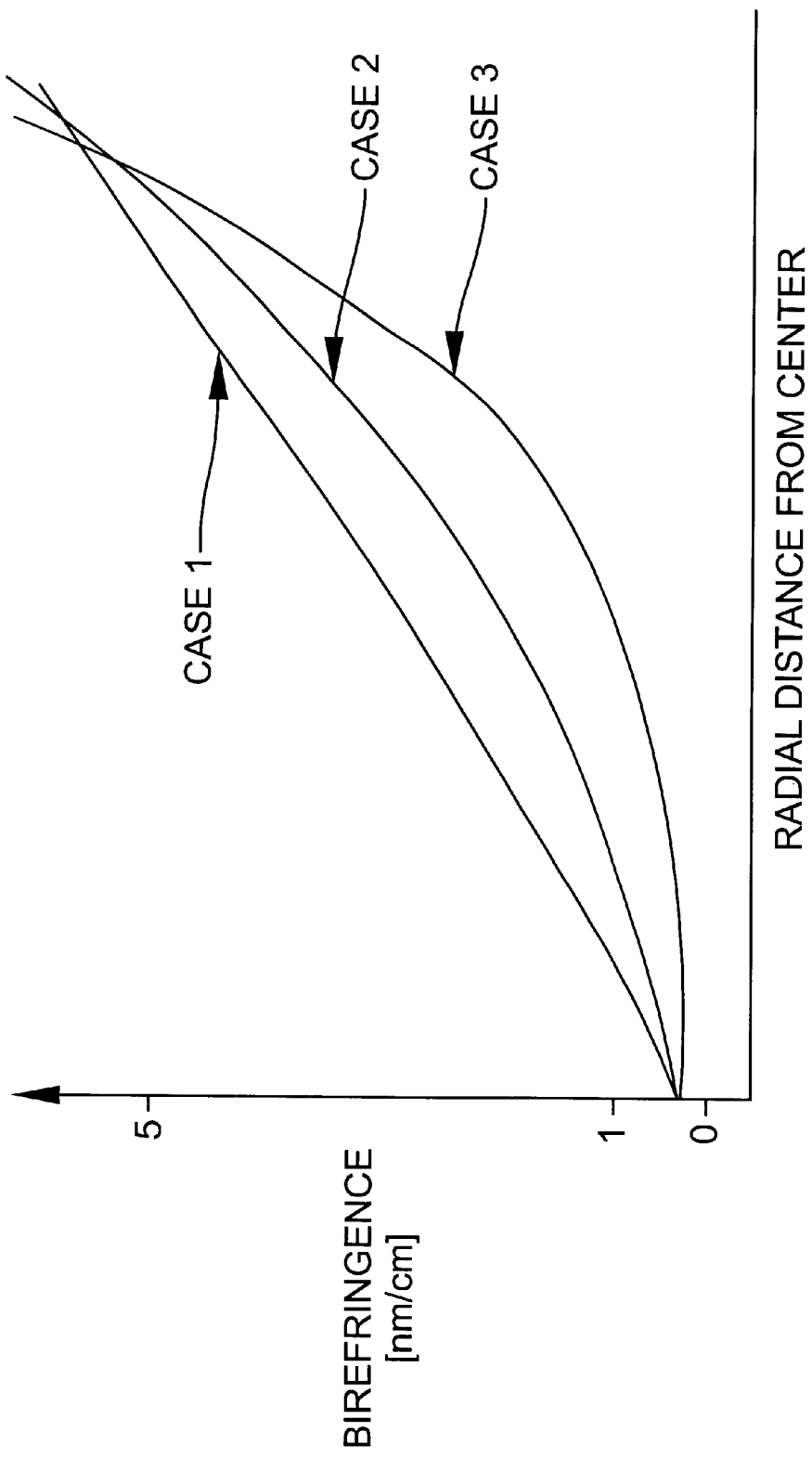
FIG. 4 is a graph of birefringence in crystals annealed under the conditions of FIG. 2.

FIG. 4 is a graph of the birefringence (expressed in nm/cm) of $CaF_2$ crystals annealed with the temperatures, times, and vertical temperature gradients of FIG. 2, graphed as a function of radial distance. Case 1 is the birefringence of a crystal annealed with conventional annealing process conditions. Case 2 and Case 3 exhibit lower birefringence at shorter radial distances compared to Case 1. Case 2 and Case 3 also exhibit birefringence below a critical threshold level at larger radial distances than Case 1, allowing larger diameter optical elements with desirable optical properties to be made from crystals annealed according to the present invention.

The method of the present invention, when practiced in connection with a crystal annealing apparatus like that discussed below, having a primary heating system mounted near the top and sides of the crystal, and a secondary heating system mounted near the bottom of the crystal, comprises supplying heat using the primary and secondary heating systems to maintain the crystal's temperature at a decreasing value over time while preventing any temperature gradients of over about 8° C. per inch in the crystal (gradients of less than about 4° C. per inch can yield even better results).

The method of the present invention, when practiced in connection with a crystal growth and annealing apparatus like that discussed below, having a primary heating system mounted near the top and sides of the crystal and a secondary heating system mounted near the bottom of the crystal, comprises:

1. Forming a liquid of crystal material in a crucible by heating the crystal material using heat from the primary heating system;
2. Lowering the crucible out of the primary heating system so that successive portions of the liquid crystal material cool to a temperature suitable for crystal formation;
3. Reducing the temperature of the primary heating system;
4. Raising the crucible into the primary heating system and supplying heat from the secondary heating system;
5. Reducing the heat output of the primary and secondary heating systems so that the average temperature of the crystal is reduced over time without allowing a temperature gradient in the crystal more than about 8° C. per inch (gradients of less than about 4° C. per inch can yield even better results).

Apparatus

Figure 5:
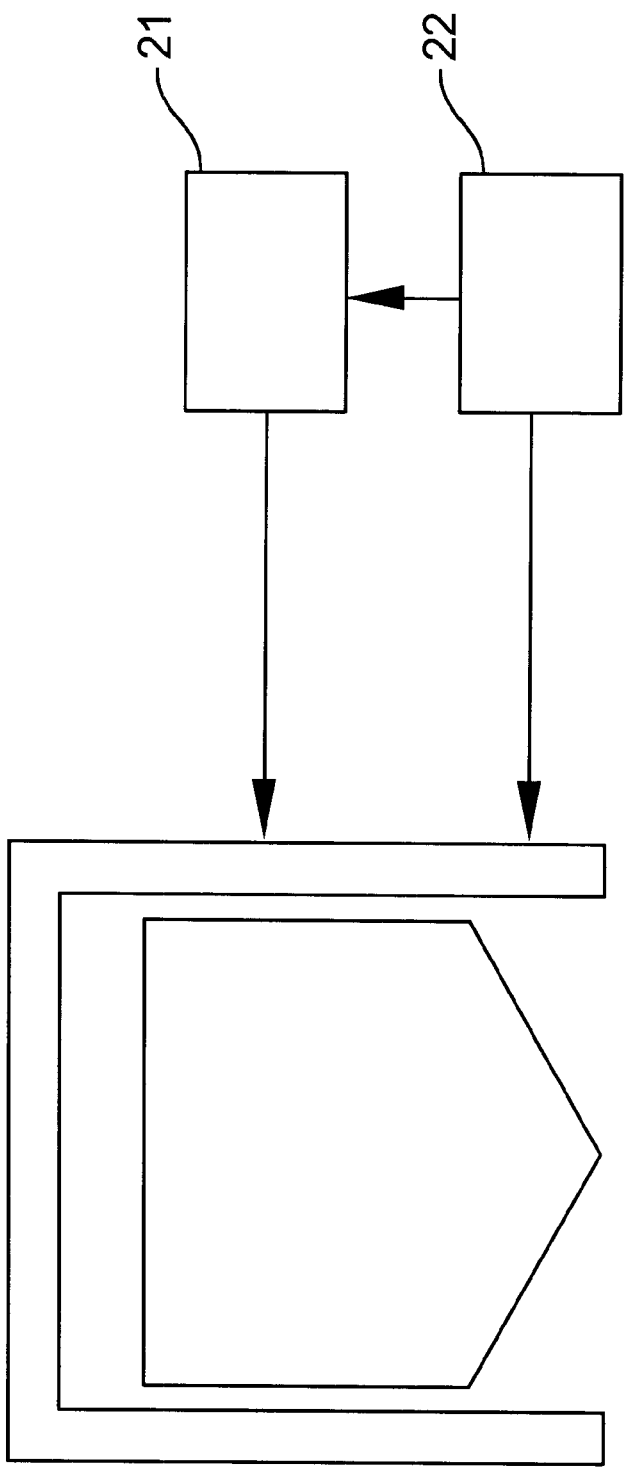
FIG. 5 is a diagram of a crystal growing and annealing apparatus according to the present invention.

An apparatus according to the present invention is shown schematically in FIG. 5. A heat source 21 can maintain the high temperature needed for crystal growth. Once the growth phase is complete, a thermal control system 22 maintains the crystal at a substantially uniform temperature during annealing. Specifically, thermal control system 22 maintains the vertical temperature gradient within limits appropriate for the crystal material, for example less than about 8° C. per inch for $CaF_2$. Temperature gradients of less than about 4° C. per inch can provide even more desirable results for $CaF_2$ crystals. Thermal control system 22 gradually reduces the temperature of the crystal during annealing without allowing a temperature gradient beyond the bounds. Thermal control system can be implemented in various ways that will be apparent to those skilled in the art, including by radiant heating elements appropriately spaced proximal the crystal, insulation, inductive heaters, monitoring and control systems, and combinations thereof.

Figure 6:
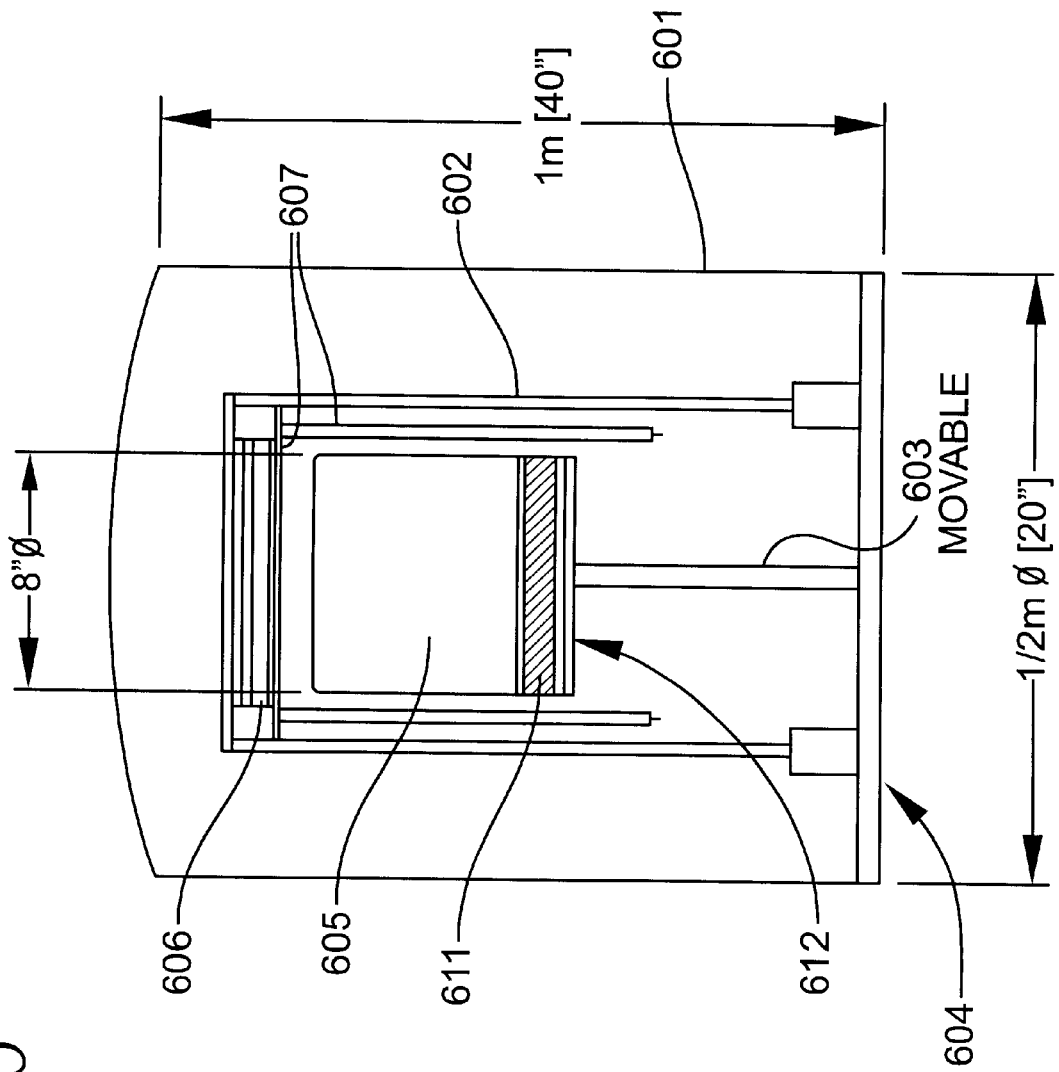
FIG. 6 is a sectional view of a crystal growth and annealing apparatus according to the present invention.

FIG. 6 is a sectional view of an apparatus according to the present invention. Apparatus A comprises several conventional elements: furnace wall 601, support structure 602, crucible support column 603, base 604, crucible 605, primary heat shields 606, and primary heaters 607, connected essentially as shown in the figure. Apparatus A further comprises secondary heater 611 and secondary heat shields 612. Secondary heater 611 can mount beneath crucible 605, with secondary heat shields 612 mounted below secondary heater 611. In operation, secondary heater 611 can be inactive during the crystal growth phase, allowing large temperature gradients compatible with crystal growth. Secondary heater 611 can be active, supplying heat, during the crystal annealing phase. Secondary heater 611 can operate in conjunction with primary heaters 607, supplying heat from below a crystal being annealed. The multiple heat sources provide the temperature profile required for annealing without allowing uneven heat loss that can lead to large temperature gradients. The power required from primary heaters 607 and secondary heater 611 is related to the furnace dimensions, crystal material characteristics, heat shield performance, and crucible dimensions. As an example, crucible 605 can be about 8 inches in diameter. Furnace wall 601 can define a volume about 20 to 40 inches in diameter and about 40 inches high. At the onset of annealing primary heaters 607 can supply about 6 kW and secondary heater 611 about 3.5 kW. The power in primary heaters 607 and secondary heater 611 can be reduced, for example linearly, during annealing. Primary 606 and secondary heat shields 612 can be of graphite, ¼ to ½ inch thick. Those skilled in the art will appreciate other sizes, power ratings, and materials compatible with the present invention.

Figure 7:
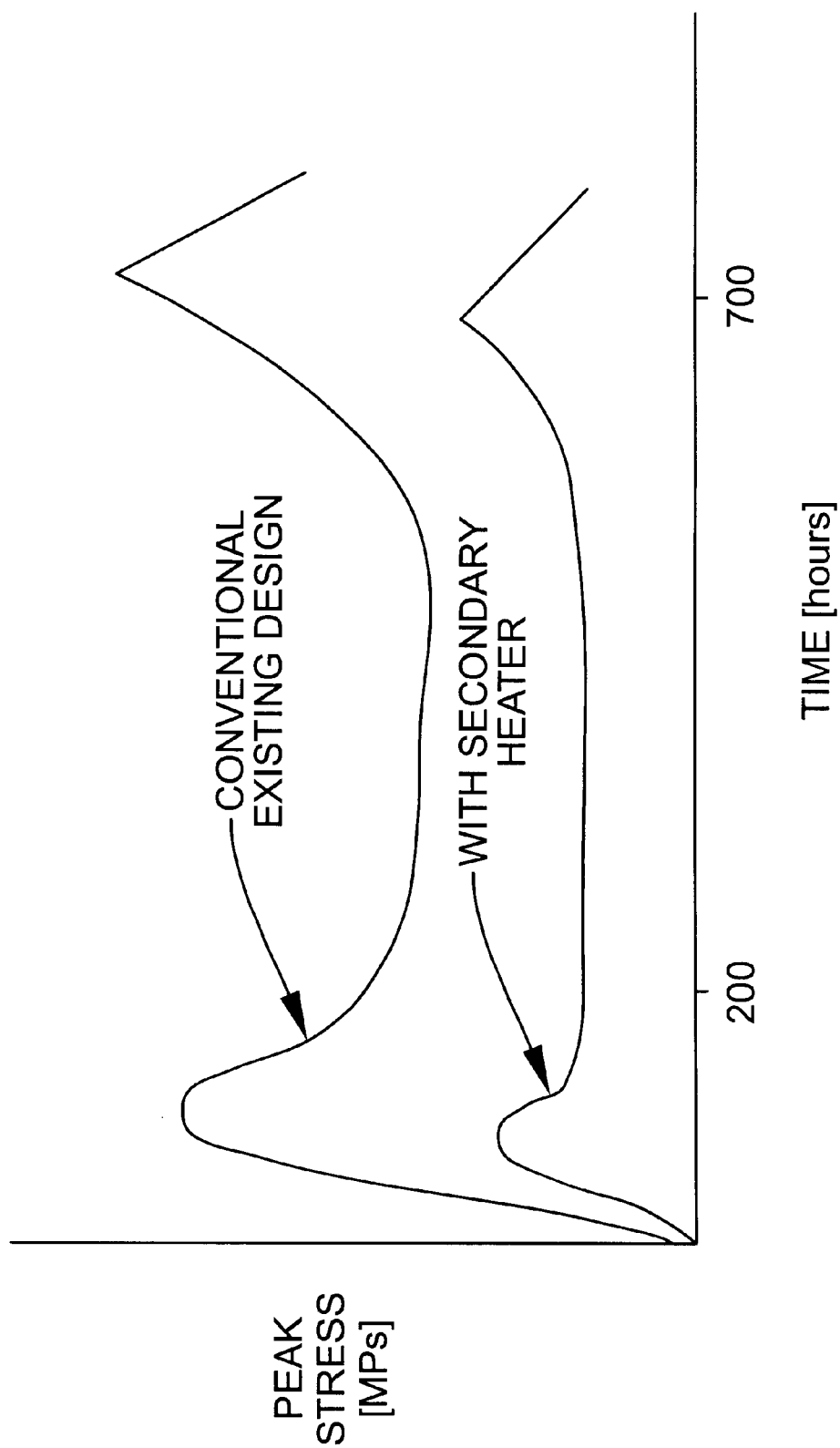
FIG. 7 is a graph of peak stress in a crystal annealed in the apparatus of FIG. 6 compared with a crystal annealed in a conventional apparatus.

FIG. 7 is a graph of the peak stress in a crystal annealed in the apparatus of FIG. 6 compared with the peak stress of a crystal annealed in a conventional apparatus. The graph was obtained using computer models of the apparatus and process. As shown in FIG. 7, the crystal annealed with the apparatus of FIG. 6 experiences lower stresses during annealing, because the secondary heaters and secondary heat shields prevent large temperature gradients that contribute to large stresses. Lower stresses during annealing means that the crystal has a lower likelihood of experiencing dislocation motion and slippage, and having consequent undesirable optical properties. For $CaF_2$ crystals, the peak stress with a conventional apparatus can be about 7 Mpa, but only about 4.5 MPa with the apparatus according to the present invention. The annealing time can be about 700 hours.

Figure 8:
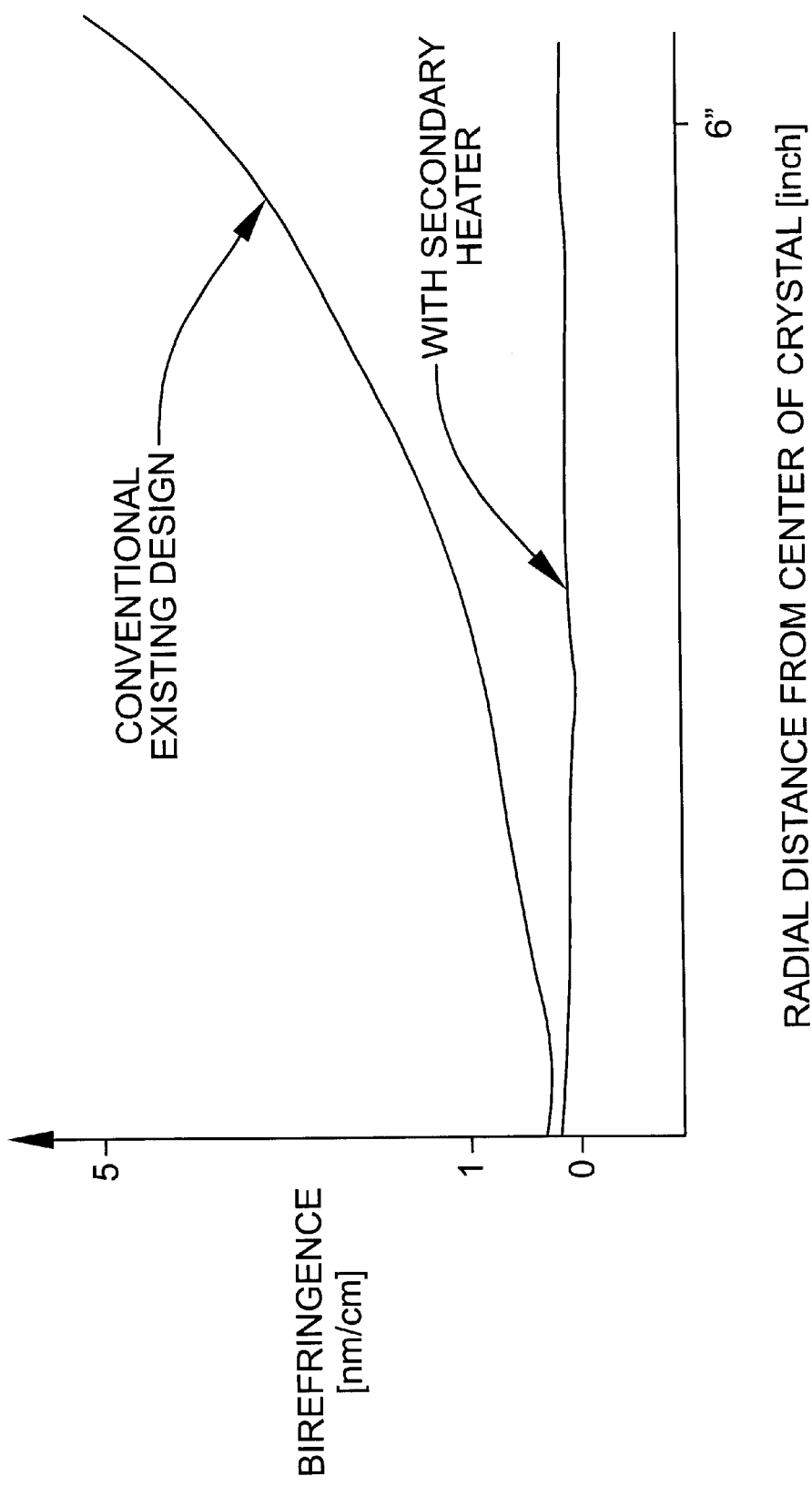
FIG. 8 is a graph of birefringence in a crystal annealed in the apparatus of FIG. 6 compared with a crystal annealed in a conventional apparatus.

FIG. 8 is a graph of the birefringence (expressed as nm/cm) as a function of radial distance (for example, from the center to 6 inches for a $CaF_2$ crystal) of a crystal annealed with the apparatus of FIG. 6 compared with that of a crystal annealed with a conventional apparatus. The graph was obtained using computer models of the apparatus and process. As shown in FIG. 8, the crystal annealed with the apparatus of FIG. 6 exhibits lower birefringence, especially at large radial distances. Low birefringence at large radial distances allows large optical elements and improved optical performance.

The particular sizes and equipment discussed above are cited merely to illustrate particular embodiments of the invention. It is contemplated that the use of the invention may involve components having different sizes and characteristics. It is intended that the scope of the invention be defined by the claims appended hereto.

We claim:

1. A crystal growth and annealing apparatus suitable for production of a fluoride crystal with minimized residual stress and birefringence, comprising:
    a) a support structure;
    b) a movable crucible comprising a liquid phase end adapted to contain liquid crystal material and a crystal growth end adapted to contain solid crystal material within the support structure;
    c) a primary heating system mounted with the support structure proximal the liquid phase end and sides of the crucible; and
    d) a movable secondary heating system mounted with the support structure proximal the crystal growth end of the crucible said secondary heating system controllable independently from said primary heating system, said secondary heating system movable with said movable crucible wherein birefringence is minimized.

2. The apparatus of claim 1, wherein the primary heating system comprises a primary heat shield mounted with support structure and a primary heating element mounted between the primary heat shield and the crucible.

3. The apparatus of claim 1, wherein the movable secondary heating system comprises a movable secondary heat shield mounted with the support structure and a movable secondary heating element mounted between the secondary heat shield and the crucible.

4. The apparatus of claim 1, wherein the primary heating system comprises a primary heat shield mounted with the support structure and a primary heating element mounted between the primary heat shield and the crucible, and wherein the movable secondary heating system comprises a movable secondary heat shield mounted with the support structure and a movable secondary heating element mounted between the movable secondary heat shield and the crucible.

5. The apparatus of claim 1, wherein the crucible is at least 8 inched it diameter, the primary heating system comprises electric resistive heaters mounted substantially surrounding the crucible, the movable secondary heating system comprises a movable electric resistive heater, and a movable secondary heat shield comprises graphite.

6. The apparatus of claim 1, wherein the crystal is $CaF_2$.

7. The apparatus of claim 1, wherein the crystal is $MgF_2$.

8. The apparatus of claim 1, wherein the crystal growth end is the bottom end of the crucible.

9. A crystal annealing apparatus suitable for production of a fluoride crystal with minimized residual stress and birefringence, comprising
    a) a support structure;
    b) a movable crucible comprising sides and two ends adapted to contain a crystal within the support structure;
    c) a primary heating system mounted with the support structure proximal the first end and sides of the crucible; and
    d) a movable secondary heating system mounted with the support structure proximal the second end of the crucible, wherein the primary heating system and secondary heating system have heating capacities that maintain the crystal temperature uniform to within about 8° C. per inch with said secondary heating system movable with said crucible.

10. The apparatus of claim 9, wherein the primary heating system and secondary heating system have heating capacities that maintain the crystal temperature uniform to within about 4° C. per inch with said secondary heating system movable with said crucible.

11. The apparatus of claim 9, wherein the second end is the bottom end of the crucible.

12. A crystal growth and annealing apparatus, comprising:
    a) a support structure;
    b) a primary heating system mounted with the support structure;
    c) a movable crucible support mounted with the support structure movable between first and second positions;
    d) a movable crucible comprising a liquid phase end adapted to hold liquid crystal material and crystal growth end adapted to hold solid crystal material, mounted with the movable crucible support so that the crystal growth end is proximal the primary heating system when the movable crucible support is in the first position and outside the primary heating system when the movable crucible support is in the second position; and e) a movable secondary heating system mounted with the crucible support proximal the of the crucible.

13. The apparatus of claim 12, wherein the primary heating system and the movable secondary heating system have heating capacities that maintain the temperature of a crystal within the crucible uniform to within about 4° C. per inch.

14. The apparatus of claim 12, wherein the primary heating system comprises a primary heat shield mounted with the support structure and a primary heating element mounted between the primary heat shield and the crucible.

15. The apparatus of claim 12, wherein the movable secondary heating system comprises a movable secondary heat shield mounted with the movable crucible support and a movable secondary heating element mounted between the movable secondary heat shield and the crucible.

16. The apparatus of claim 12, wherein the primary heating system comprises a primary heat shield mounted with the support structure and a primary heating element mounted between the primary heat shield and the crucible, and wherein the movable secondary heating system comprises a movable secondary heat shield mounted with the movable crucible support and a movable secondary heating element mounted between the movable secondary heat shield and the crucible.

17. The apparatus of claim 12, wherein the crucible is at least 8 inches in diameter, the primary heating system comprises electric resistive heaters mounted substantially surrounding the crucible, the movable secondary heating system comprises a movable electric resistive heater.

18. The apparatus of claim 12, wherein the crystal is $CaF_2$.

19. The apparatus of claim 12, wherein the crystal is $MgF_2$.

20. The apparatus of claim 12, wherein the primary heating system and the movable secondary heating system have heating capacities that maintain the temperature of a crystal within the crucible uniform to within about 8° C. per inch.

21. The apparatus of claim 12, wherein the second position is below the primary heating system.

* * * * *